United States Patent [19]
Opris

[11] Patent Number: 5,838,200
[45] Date of Patent: Nov. 17, 1998

[54] DIFFERENTIAL AMPLIFIER WITH SWITCHED CAPACITOR COMMON MODE FEEDBACK

[75] Inventor: Ion E. Opris, Sunnyvale, Calif.

[73] Assignee: National Semiconductor Corporation, Santa Clara, Calif.

[21] Appl. No.: 870,845

[22] Filed: Jun. 6, 1997

[51] Int. Cl.$^6$ ...................................................... H03F 3/45
[52] U.S. Cl. ................................ 330/258; 330/9; 330/51; 330/253; 330/311
[58] Field of Search ................................ 330/9, 51, 253, 330/258, 311

[56] References Cited

U.S. PATENT DOCUMENTS

| | | | |
|---|---|---|---|
| 4,714,895 | 12/1987 | Nicollini et al. | 330/258 |
| 4,720,686 | 1/1988 | Westwick | 330/258 |

OTHER PUBLICATIONS

Germano Nicollini, Pierangelo Confalonieri, and Daniel Senderowicz, "A Fully Differential Sample–and–Hold Circuit for High–Speed Applications", IEEE Journal of Solid–State Circuits, vol. 24, No. 5, Oct. 1989, pp. 1461–1465.

Paul R. Gray and Robert G. Meyer, "MOS Operational Amplifier Design–A Tutorial Overview", IEEE Journal of Solid–State Circuits, vol. SC–17, No. 6, Dec. 1982, pp. 969–982.

*Primary Examiner*—James B. Mullins
*Attorney, Agent, or Firm*—Limbach & Limbach L.L.P.

[57] ABSTRACT

A differential amplifier with switched capacitor common mode feedback includes a differential telescopic cascode amplifier in which the differential output terminals are individually coupled to a common mode input bias terminal via separate feedback capacitors. During a first time period (e.g., a sampling period), the output terminals are connected together via a pair of output switches to provide a common mode output voltage in response to a common mode input bias voltage applied to the bias terminal via an input switch. An operational amplifier compares the common mode output voltage to a common mode reference voltage and, based upon the difference between such voltages, generates the common mode input bias voltage. During a second time period (e.g., a holding period), the input and output switches are all opened and the output terminals provide a differential output voltage in response to a differential input signal applied to the differential input terminals.

20 Claims, 3 Drawing Sheets

DIFFERENTIAL AMPLIFIER WITH SWITCHED CAPACITOR COMMON MODE FEEDBACK

BACKGROUND OF THE INVENTION

1. Field of the Invention

The present invention relates to operational amplifiers used for driving capacitive loads, and in particular, to operational amplifiers used to perform high speed sample and hold operations in a differential mode with switched capacitor circuits.

2. Description of the Related Art

High speed switched capacitor circuits, such as those used to perform sample and hold operations in analog-to-digital converters, require fast operational amplifiers to achieve fast settling times. To minimize noise, most implementations are fully differential. However, differential implementations require extra circuitry to establish the common mode voltage level. The types of amplifiers often used include folded cascode and telescopic operational amplifiers. Such amplifiers provide high gain and good stability with the capacitive loads. (An overview of such amplifier circuits can be found in Gray and Meyer, "MOS Operational Amplifier Design—A Tutorial Overview," IEEE Journal of Solid State Circuits, Vol. 17, No. 6, December 1982, pp. 969–82, the disclosure of which is incorporated herein by reference.)

One technique often used to implement a fully differential mode of operation is the use of common mode feedback. The preferred implementation for common mode feedback is by the use of switched capacitors, as shown in FIG. 1. The switched capacitors C3, C4 are used to perform a level shift between the common mode output potential VCOM and the replica bias level BIASN for the lower current source transistor M5. (Further discussions of this widely used conventional technique can be found in: Nicollini, Confalonieri and Senderowicz, "A Fully Differential Sample-and-Hold Circuit for High Speed Applications," IEEE Journal of Solid State Circuits, Vol. 24, No. 5, October 1989, pp. 1461–65; and Nicollini and Senderowicz, "Internal All-Differential Operational Amplifier for CMOS Integrated Circuits," U.S. Pat. No. 4,714,895; the disclosures of which are incorporated herein by reference.)

This technique, however, has a number of disadvantages. Since both plates of the switched capacitors C3, C4 are switched, a special clock or control signal is required to synchronize the switches S3a, S3b, S4a, S4b so as to minimize charge injection. Additionally, any error in the bias voltage BIASN at the gate of transistor M5 is directly reflected into the common mode error within the differential output signal VOUT+/VOUT−. Further, the telescopic amplifiers have a small common mode range at the input VIN+/VIN−, particularly when used in a high output voltage swing application (e.g., in a pipeline converter). And, since the input is typically driven by an identical stage, the overall circuit has poor tolerance to errors in the common mode voltage level. Further still, if the level shifting capacitors C3, C4 have small values as compared with those of the primary feedback capacitors C1, C2, the transient time for the initial output common mode setting can be quite long. On the other hand, however, if the values of the level shifting capacitors C3, C4 are larger than those of the primary feedback capacitors C1, C2, they will add to the capacitive load at the output VOUT+/VOUT− and reduce the overall circuit bandwidth.

Referring to FIG. 2, an alternative conventional technique avoids the need for the switched capacitors C3, C4. During a sample phase, i.e., when the input switch SI and output switches SO1, SO2 are closed, the replica bias voltage BIASN is applied to the gate of transistor M5 and the differential output VOUT+/VOUT− nodes are shorted together to receive the common mode output voltage VCOM. This technique is advantageous in that the outputs VOUT+/VOUT− are shorted to a common potential VCOM, thereby ensuring that the stewing time during the next hold phase is reduced and reducing the overall settling time. However, any error in the replica bias potential BIASN is reflected in an error in the common mode output potential VCOM, as well as larger currents through the switches SO1, SO2. These currents not only include DC current by way of the source of the reference voltage VCOM, but are also subject to change during the transition from the sample phase to the hold phase, thereby generating a large transient within the common mode output potential VCOM.

SUMMARY OF THE INVENTION

A differential amplifier with switched capacitor common mode feedback in accordance with the present invention provides a number of advantages. The line providing the reference potential VCOM is isolated from the differential output VOUT+/VOUT− terminals of the main amplifier at all times. No DC currents are sourced or sunk from the common mode output reference VCOM line, thereby greatly reducing noise in the system. No separate bias circuit is required for providing the replica bias potential BIASN. The common mode output potential VCOM is well controlled, with any errors being dominated by an input referred offset of an operational amplifier, and no resistive divider is required for sensing the common mode potential. Frequency stability is maintained while the common mode feedback loop unity gain bandwidth is established independently of the differential mode bandwidth.

In accordance with one embodiment of the present invention, a differential amplifier with switched capacitor common mode feedback includes a differential amplifier, two capacitive circuits, a control circuit, an input circuit and two output circuits. The differential amplifier includes a common mode input terminal configured to receive a common mode input voltage during a first time period, differential input terminals configured to receive a differential input signal and differential output terminals configured to provide together during the first time period a common mode output voltage in accordance with the common mode input voltage and to provide during a second time period a differential output voltage in accordance with the differential input signal. One of the capacitive circuits is coupled between the common mode input terminal and one of the differential output terminals. The other capacitive circuit is coupled between the common mode input terminal and the other differential output terminal. The control circuit includes one input configured to receive a reference voltage, another input configured to receive the common mode output voltage and an output configured to provide the common mode input voltage in accordance with the difference between the reference voltage and the common mode output voltage. The input circuit is coupled between the common mode input terminal and the control circuit output and includes a first state in which the common mode input terminal is coupled to the control circuit output during the first time period and further includes a second state in which the common mode input terminal is decoupled from the control circuit output during the second time period. One of the output circuits is coupled between the first differential output terminal and the second control circuit input and includes a first state in which the first differential output terminal is coupled to the second control circuit input during the first time period and further includes a second state in which the first differential output terminal is decoupled from the second control circuit input during the second time period. The second output circuit is coupled between the second differential output terminal and the second control circuit input and includes a first state in which the second differential output terminal is coupled to the second control circuit input during the first time period and further includes a second state in which the second differential output terminal is decoupled from the second control circuit input during the second time period.

These and other features and advantages of the present invention will be understood upon consideration of the following detailed description of the invention and the accompanying drawings.

DETAILED DESCRIPTION OF THE INVENTION

Figure 1:
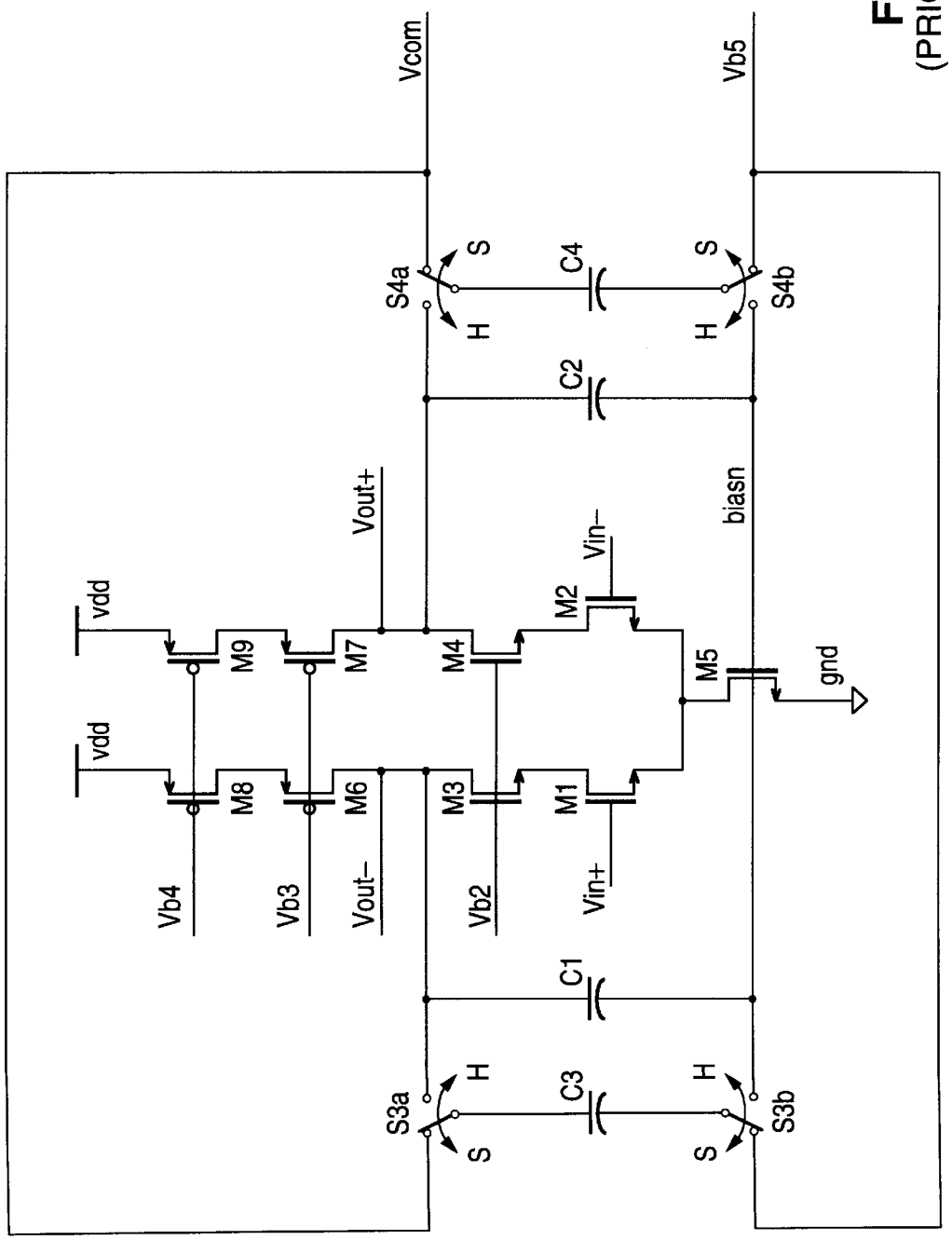
FIG. 1 is a schematic circuit diagram of a conventional differential amplifier with switched capacitor common mode feedback.
Figure 2:
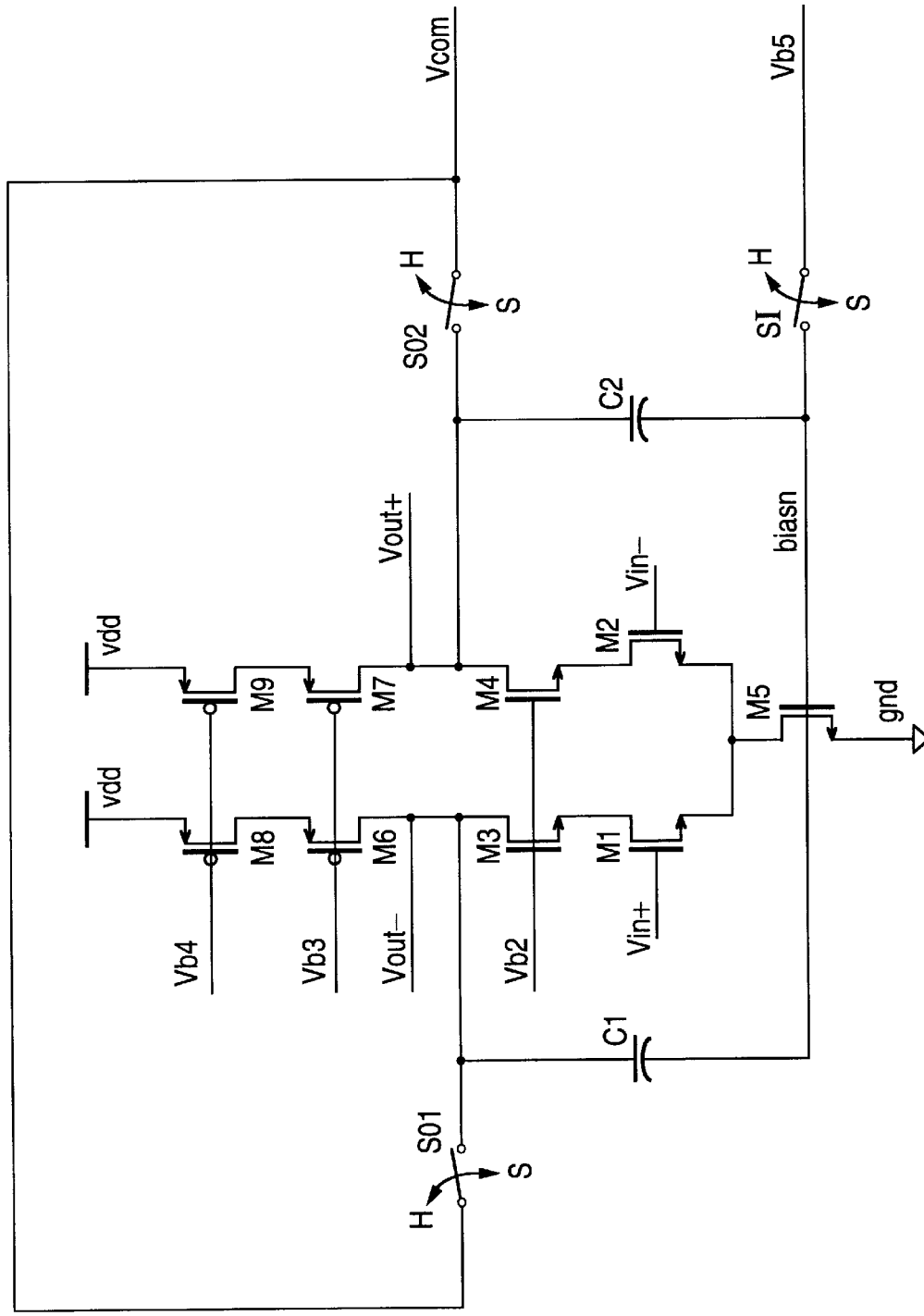
FIG. 2 is a schematic circuit diagram of another conventional differential amplifier with switched capacitor common mode feedback.
Figure 3:
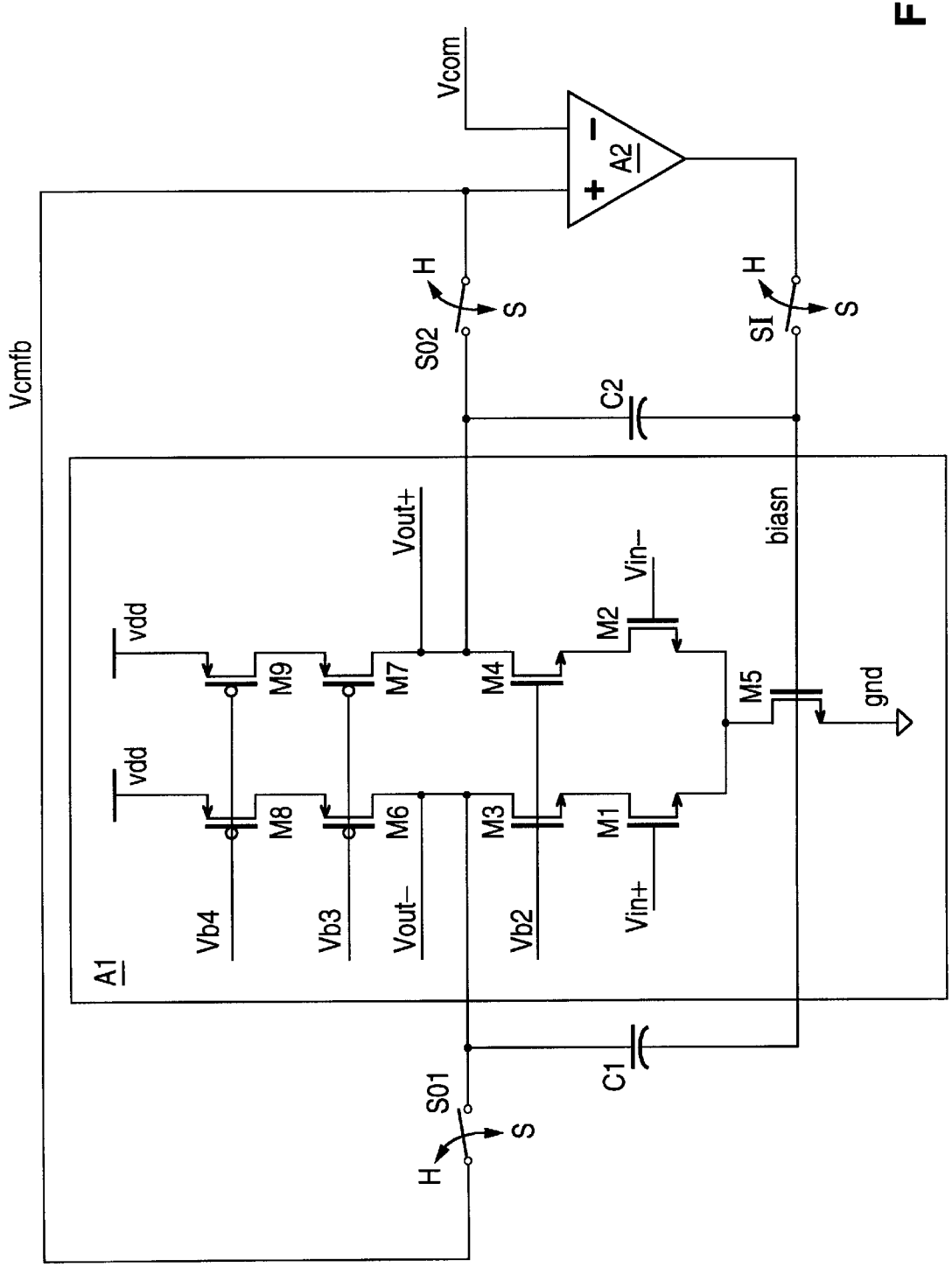
FIG. 3 is a schematic circuit diagram of a differential amplifier with switched capacitor common mode feedback in accordance with one embodiment of the present invention.

Referring to FIG. 3, a differential amplifier with switched capacitor common mode feedback in accordance with one embodiment of the present invention includes a differential amplifier A1, feedback capacitors C1, C2, an operational amplifier A2, an input switch SI and two output switches SO1, SO2. The differential amplifier A1 is conventional in its design and operation. Opposing N-channel metal oxide semiconductor field effect transistors (N-MOSFETs) M1 and M2 receive the differential input signal VIN+/VIN− and are biased directly by N-MOSFET M5 which operates as a current source controlled by the common mode input bias potential BIASN. The upper P-channel MOSFETs (P-MOSFETs) M6, M7, M8, M9 together provide independent matched current sources, controlled by externally generated biasing potentials VB3, VB4, for the two branches of the differential amplifier A1. The differential output signal VOUT+/VOUT− is provided at the drain terminals of P-MOSFETs M6 and M7 and N-MOSFETs M3 and M4 (the latter devices being biased by another externally generated bias potential VB2).

The feedback capacitors C1, C2 provide common mode feedback between the differential output VOUT+/VOUT− terminals and the common mode input BIASN terminal. The operational amplifier A2 operates as an error amplifier in that it provides via the input switch SI the common mode biasing potential BIASN based upon the difference between the common mode feedback potential VCMFB at its non-inverting input terminal and the common mode reference potential VCOM at its inverting input terminal. When closed, the output switches SO1, SO2 short the differential output terminals of the differential amplifier A1 to provide the common mode feedback voltage VCMFB, and, when opened, allow the differential output terminals to provide the two phases of the differential output signal VOUT+/VOUT−. All three switches SI, SO1, SO2 are closed during the sample phase and are opened during the hold phase. Accordingly, the operational amplifier A2 is active only during the sample phase when it is comparing the common mode output level VCMFB to the common mode reference level VCOM. During the hold phase, the output of the operational amplifier A2 is disconnected from the common mode biasing input BIASN, thereby resulting in capacitive common mode feedback between the differential output VOUT+/VOUT− terminals and the common mode input BIASN terminal via the capacitors C1, C2.

During the sample phase, the feedback capacitors C1, C2 are connected between the non-inverting input and output terminals of the operational amplifier A2 via the switches SI, SO1, SO2 and thereby act as Miller compensation capacitors for the operational amplifier A2. The equivalent transconductance of the operational amplifier A2 establishes the common mode feedback loop unity gain bandwidth independently of the differential mode bandwidth of the primary differential amplifier A1.

In accordance with well known conventional circuit design techniques, the switches SI, SO1, SO2 can be implemented using various forms of switches or switching circuits, including pass gates or transmission gates formed by mutually opposing, interconnected complementary pass gates. For an integrated circuit environment, each of the feedback capacitors C1, C2 can be implemented using various forms of capacitive circuits, including MOSFETs in which the gate terminal serves as one capacitor plate and mutually shorted drain and source terminals serve as the other capacitor plate.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a differential amplifier with switched capacitor common mode feedback, comprising:

a differential amplifier which includes a common mode input terminal configured to receive a common mode input voltage during a first time period, first and second differential input terminals configured to receive a differential input signal, and first and second differential output terminals configured to provide together during said first time period a common mode output voltage in accordance with said common mode input voltage and to provide during a second time period a differential output voltage in accordance with said differential input signal;

a first capacitive circuit coupled between said common mode input terminal and said first differential output terminal;

a second capacitive circuit coupled between said common mode input terminal and said second differential output terminal;

a control circuit which includes a first input configured to receive a reference voltage, a second input configured to receive said common mode output voltage and an output configured to provide said common mode input voltage in accordance with a difference between said reference voltage and said common mode output voltage;

an input circuit which is coupled between said common mode input terminal and said control circuit output and includes a first state in which said common mode input terminal is coupled to said control circuit output during said first time period and further includes a second state in which said common mode input terminal is decoupled from said control circuit output during said second time period;

a first output circuit which is coupled between said first differential output terminal and said second control circuit input and includes a first state in which said first differential output terminal is coupled to said second control circuit input during said first time period and further includes a second state in which said first differential output terminal is decoupled from said second control circuit input during said second time period; and a second output circuit which is coupled between said second differential output terminal and said second control circuit input and includes a first state in which said second differential output terminal is coupled to said second control circuit input during said first time period and further includes a second state in which said second differential output terminal is decoupled from said second control circuit input during said second time period.

2. The apparatus of claim 1, wherein said differential amplifier comprises a plurality of interconnected complementary metal oxide semiconductor field effect transistors.

3. The apparatus of claim 1, wherein said differential amplifier comprises a differential telescopic cascode amplifier.

4. The apparatus of claim 1, wherein said first capacitive circuit comprises a capacitor.

5. The apparatus of claim 1, wherein said first capacitive circuit comprises a metal oxide semiconductor field effect transistor with mutually shorted drain and source terminals.

6. The apparatus of claim 1, wherein said control circuit comprises an operational amplifier.

7. The apparatus of claim 1, wherein said input circuit comprises a single pole single throw switch.

8. The apparatus of claim 1, wherein said input circuit comprises a pass gate.

9. The apparatus of claim 1, wherein said first output circuit comprises a single pole single throw switch.

10. The apparatus of claim 1, wherein said first output circuit comprises a pass gate.

11. An apparatus including a differential amplifier with switched capacitor common mode feedback, comprising:
a differential amplifier which includes
a common mode input terminal configured to receive a common mode input voltage during a first time period,
first and second differential input terminals configured to receive a differential input signal, and
first and second differential output terminals configured to provide together during said first time period a common mode output voltage in accordance with said common mode input voltage and to provide during a second time period a differential output voltage in accordance with said differential input signal;

a first capacitor coupled between said common mode input terminal and said first differential output terminal;

a second capacitor coupled between said common mode input terminal and said second differential output terminal;

an operational amplifier with a first input configured to receive a reference voltage, a second input configured to receive said common mode output voltage and an output configured to provide said common mode input voltage in accordance with a difference between said reference voltage and said common mode output voltage;

an input switch coupled between said common mode input terminal and said operational amplifier output with an on state in which said common mode input terminal is coupled to said operational amplifier output during said first time period and further with an off state in which said common mode input terminal is decoupled from said operational amplifier output during said second time period;

a first output switch coupled between said first differential output terminal and said second operational amplifier input with an on state in which said first differential output terminal is coupled to said second operational amplifier input during said first time period and further with an off state in which said first differential output terminal is decoupled from said second operational amplifier input during said second time period; and a second output switch coupled between said second differential output terminal and said second operational amplifier input with an on state in which said second differential output terminal is coupled to said second operational amplifier input during said first time period and further with an off state in which said second differential output terminal is decoupled from said second operational amplifier input during said second time period.

12. The apparatus of claim 11, wherein said differential amplifier comprises a plurality of interconnected complementary metal oxide semiconductor field effect transistors.

13. The apparatus of claim 11, wherein said differential amplifier comprises a differential telescopic cascode amplifier.

14. The apparatus of claim 11, wherein said first capacitor comprises a metal oxide semiconductor field effect transistor with mutually shorted drain and source terminals.

15. The apparatus of claim 11, wherein said input switch comprises a pass gate.

16. The apparatus of claim 11, wherein said first output switch comprises a pass gate.

17. A method of generating a differential signal using switched capacitor common mode feedback, said method comprising the steps of:
receiving a common mode input voltage via a common mode input terminal during a first time period;
receiving a differential input signal;
outputting via first and second differential output terminals together during said first time period a common mode output voltage in accordance with said common mode input voltage;
outputting via said first and second differential output terminals during a second time period a differential output voltage in accordance with said differential input signal;
capacitively coupling said common mode input terminal and said first differential output terminal;

capacitively coupling said common mode input terminal and said second differential output terminal;

receiving a reference voltage;

generating said common mode input voltage in accordance with a difference between said reference voltage and said common mode output voltage;

coupling said common mode input voltage to said common mode input terminal during said first time period and decoupling said common mode input voltage from said common mode input terminal during said second time period; and coupling said first and second differential output terminals together during said first time period and decoupling said first and second differential output terminals from each other during said second time period.

18. The method of claim 17, wherein said step of generating said common mode input voltage in accordance with a difference between said reference voltage and said common mode output voltage comprises differentially receiving said reference voltage and said common mode output voltage and generating said common mode input voltage with an operational amplifier.

19. The method of claim 17, wherein said step of coupling said common mode input voltage to said common mode input terminal during said first time period and decoupling said common mode input voltage from said common mode input terminal during said second time period comprises applying said common mode input voltage to said common mode input terminal and removing said common mode input voltage from said common mode input terminal, respectively, via a switch.

20. The method of claim 17, wherein said step of coupling said first and second differential output terminals together during said first time period and decoupling said first and second differential output terminals from each other during said second time period comprises connecting and disconnecting said first and second differential output terminals, respectively, via one or more switches.

* * * * *